United States Patent [19]

Plus et al.

[11] Patent Number: 4,864,380
[45] Date of Patent: Sep. 5, 1989

[54] EDGELESS CMOS DEVICE

[75] Inventors: Dora Plus, South Bound Brook; Alfred C. Ipri, Hopewell Township, Mercer County, both of N.J.

[73] Assignee: General Electric Company, Schenectady, N.Y.

[21] Appl. No.: 274,629

[22] Filed: Nov. 18, 1988

Related U.S. Application Data

[63] Continuation of Ser. No. 48,705, May 12, 1987, abandoned.

[51] Int. Cl.$^4$ .............................................. H01L 27/12
[52] U.S. Cl. ........................................ 357/42; 357/23.7; 357/23.11; 357/49
[58] Field of Search .................... 357/42, 23.7, 23.11, 357/49

[56] References Cited

U.S. PATENT DOCUMENTS

| | | | |
|---|---|---|---|
| 3,868,721 | 2/1975 | Davidsohn | 357/23.11 |
| 3,890,632 | 6/1975 | Ham et al. | 357/23 |
| 4,015,279 | 3/1977 | Ham | 357/23 |
| 4,054,894 | 10/1977 | Heagerty et al. | 357/23 |
| 4,054,895 | 10/1977 | Ham | 357/23 |
| 4,063,274 | 12/1977 | Dingwall | 357/42 |
| 4,070,211 | 1/1978 | Harari | 148/187 |
| 4,178,191 | 12/1979 | Flatley | 148/1.5 |
| 4,185,319 | 1/1980 | Stewart | 365/185 |
| 4,252,574 | 2/1981 | Fabula | 148/1.5 |
| 4,393,572 | 7/1983 | Policastro et al. | 29/571 |
| 4,547,790 | 10/1985 | Egawa | 357/23.7 |

OTHER PUBLICATIONS

Stewart, "CMOS/SOS EAROM Memory Arrays", *IEEE Journal of Solid-State Circuits*, vol. SC-14, No. 5, pp. 860-864.

*Primary Examiner*—William D. Larkins
*Attorney, Agent, or Firm*—Henry I. Steckler; James C. Davis, Jr.; Paul R. Webb, II

[57] ABSTRACT

A common island complementary-metal-oxide semiconductor device comprising an island of semiconductor material disposed on an insulating substrate is disclosed. Both N-channel and P-Channel transistors are formed in the common island of semiconductor material, but the gate electrode does not extend over the sidewalls of the silicon island. In order to electrically isolate the source and drain regions for each transistor, the areas of the silicon island outside of the channel region are doped with the appropriate dopants to form back-to-back diodes in series with respect to the source and drain regions. Additionally, a diode is disposed between both the N-channel and P-channel transistors to electrically isolate the two transistors.

5 Claims, 2 Drawing Sheets

EDGELESS CMOS DEVICE

This application is a continuation of application Ser. No. 07/048,705 filed May 12, 1987, now abandoned.

The present invention relates to a complementary-metal-oxide-semiconductor device which eliminates the parasitic edge transistors.

BACKGROUND OF THE INVENTION

Silicon-on-insulator (SOI) semiconductor devices generally include a silicon island formed on the surface of an insulating material. Metal-oxide-semiconductor (MOS) transistors are formed in and on the silicon island. Additionally, it is known to form a complementary-metal-oxide-semiconductor (CMOS) device in an SOI structure. When the insulating material is a sapphire substrate, the structure is known as a silicon-on-sapphire (SOS) semiconductor device. However, the insulating material may also be a layer of silicon dioxide which is disposed on a semiconductor substrate. MOS/SOI transistors generally have higher speed and improved radiation hardness in comparison with MOS transistors formed in bulk silicon.

Referring now to FIG. 1, a conventional silicon-on-insulator semiconductor device is generally designated as 10. The device 10 is a silicon-on-sapphire semiconductor device because a silicon island 12 is formed on a sapphire substrate 14. The silicon island 12 is doped P-type; however, it also contains N-type source and drain regions 13 and 15, respectively. A gate oxide layer (not shown) is disposed on the surface of the silicon island 12 under at least the gate electrode 20. The device 10 actually consists of three transistors in parallel. The first transistor is formed on the top surface 16 of the silicon island 12. Two transistors are also formed along the opposed sidewalls 18 of the silicon island 12. The opposed sidewalls 18 lie under the gate electrode 20 and extend along the channel length of the SOS device. The transistors formed along the opposed sidewalls 18 are commonly referred to as parasitic edge transistors.

The parasitic edge transistors have a lower threshold voltage than the top transistor. When the parasitic edge transistors prematurely turn on, leakage currents are allowed to pass through the device. Additionally, when an N-channel SOI device is subjected to ionizing radiation, the edge transistor problem increases. Positive charges accumulate between the gate oxide and the silicon island. These positive charges shift the threshold voltage of the top and edge transistors. However, the threshold voltage shift is greater in the parasitic edge transistors. Thus, the edge transistors turn on well before the top transistor and this is a major cause of post-radiation leakage currents in SOI devices.

The dielectric strength of the gate oxide along the edge transistor is usually poor. This can be attributed to the non-uniform thickness of the gate oxide along the sidewall of the silicon island and the increased electrical fields around the silicon island edge. The poor dielectric strength of the gate oxide on the parasitic edge transistor and the increased electrical fields around the silicon island edge lead to premature gate breakdown. The premature gate breakdown is experienced in both N-channel and P-channel transistors.

In order to avoid the problem of the lower threshold voltage of the parasitic edge transistors, the sidewalls of the silicon island for an N-channel transistor are doped heavier than the channel region. This increases the threshold voltage of the edge transistor and thus reduces the post-radiation leakage currents. One such technique for doping the sidewalls of the silicon island is described in commonly assigned U.S. Pat. No. 3,890,632 entitled "Stabilized Semiconductor Devices And Method of Making The Same" which issued to W. E. Ham et al. on June 17, 1975. In an N-channel device, the sloped sidewalls of the silicon island are ion implanted with boron. However, the plasma etching techniques which are used today to define the silicon islands typically form vertical sidewalls. It is difficult to uniformly dope the vertical sidewalls of a silicon island using the ion implantation technique described by Ham et al.

Concentric edgeless semiconductor devices have also been developed to avoid the parasitic edge transistor problem. An example of such a device can be found in commonly assigned U.S. Pat. No. 4,185,319 entitled "Non-Volatile Memory Device" issued to R. G. Stewart on Jan. 22, 1980. The drain region of the transistor is enclosed by a frame-like gate electrode which is in turn surrounded by a frame-like source region. The frame-like gate is disposed totally on the top of the silicon island; therefore, the parasitic edge transistors are eliminated. Although the structure is indeed edgeless, it is quite large and can be used in integrated circuits or portions of integrated circuits where area considerations are unimportant.

There is a need in the art for small channel width and short channel length edgeless devices so that integrated circuits with high performance and high packing densities can be fabricated. Additionally, it would be desirable to form the short channel edgeless N-channel and P-channel transistors in a single semiconductor island so as to decrease the device area of CMOS integrated circuits.

SUMMARY OF THE INVENTION

The present invention includes a semiconductor device with an island of semiconductor material disposed on an insulating substrate. Both N-channel and P-channel transistors are disposed in the common island of semiconductor material. However, the gate electrode is positioned such that it does not overlie the common boundary between the top surface and the sidewall of the silicon island. A means is disposed in the island for electrically isolating the portions of the semiconductor island which contain the N-channel and P-channel transistors. Also, means are disposed in the semiconductor island outside the channel regions of the N-channel and P-channel transistors for electrically isolating the source region from the drain region of each transistor.

DETAILED DESCRIPTION OF THE PREFERRED EMBODIMENT

The present invention will be described using single-crystalline silicon as the semiconductor material which is disposed on an insulating substrate of single-crystalline sapphire. However, it should be understood that other conventional semiconductor material, such as other forms of silicon and IIb-VIa and IIIa-Va semiconductor compounds, may be substituted for the single-crystalline silicon. Additionally, other conventional insulator substrates, such as spinel, beryllium oxide, and silicon dioxide disposed on a semiconductor material, may be substituted for sapphire.

Figure 1:
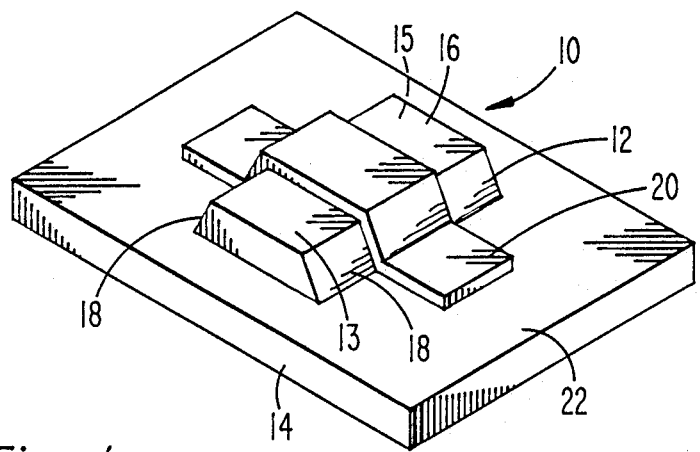
FIG. 1 is an isometric view of a conventional N-channel SOS semiconductor device illustrating the parasitic edge transistors.
Figure 2:
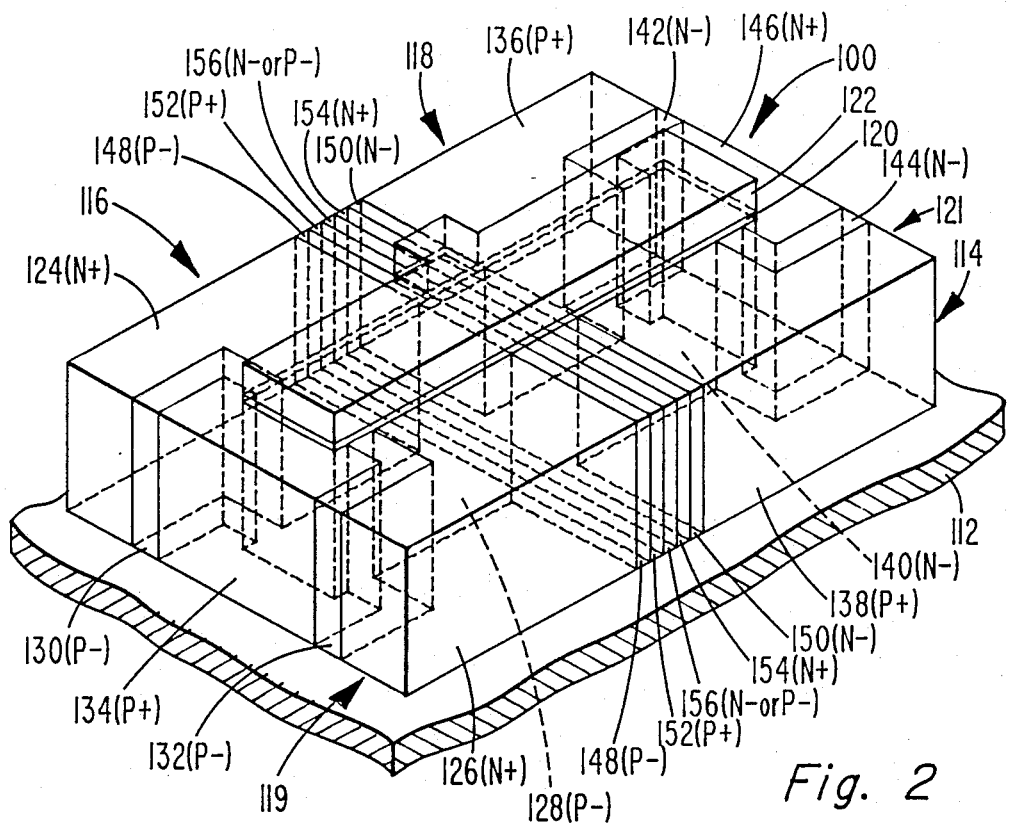
FIG. 2 is an isometric view of the common island semiconductor device of the present invention.
Figure 3:
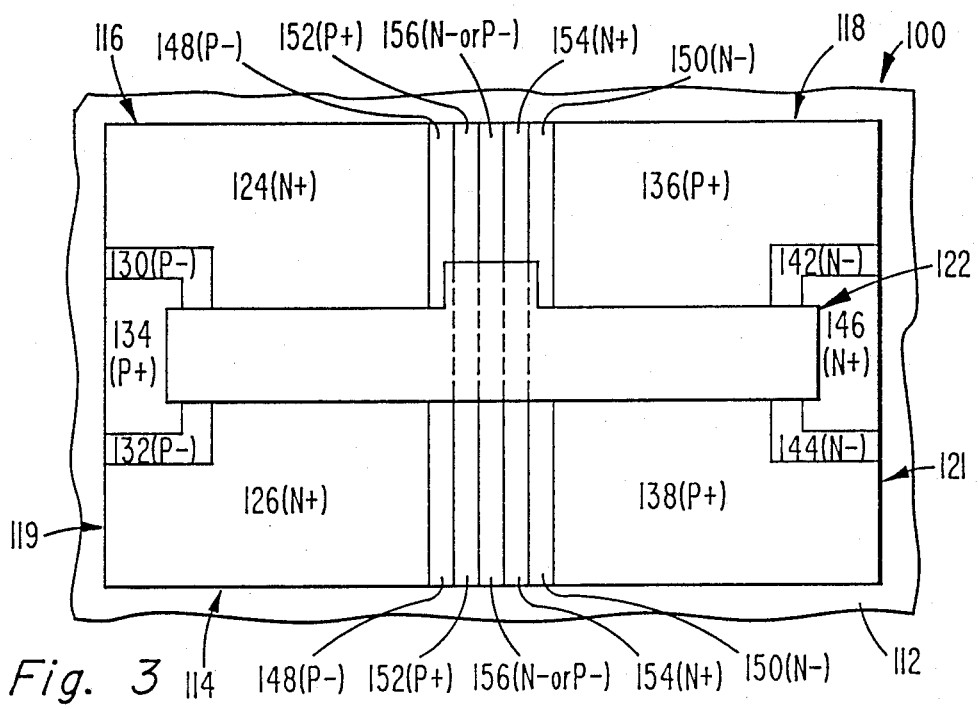
FIG. 3 is a plan view of the common island semiconductor device of the present invention.

Referring now to FIGS. 2 and 3, the common island complementary-metal-oxide-semiconductor device of the present invention formed in an SOS structure is generally designated as 100. The device 100 includes a single-crystalline sapphire substrate 112 upon which is disposed a single-crystalline silicon island 114. The silicon island 114 has a thickness of about 0.5 micrometer. The silicon island 114 is divided into a first portion 116, where the N-channel transistor will be formed, and a second portion 118, where the P-channel transistor will be located. The first portion 116 is lightly doped P-type (P−) and the second portion 118 is lightly doped N-type (N−). The dopant concentration in both the first 116 and second 118 portions is about $10^{16}$ cm$^{-3}$. A gate insulating layer 120, such as silicon dioxide, is disposed between a gate electrode 122, such as N-type polycrystalline silicon, and the top surface of the silicon island 114. The gate insulating layer 120 may also be disposed over all the exposed surfaces of the silicon island 114. As shown in FIGS. 2 and 3, the gate electrode 122 is spaced from the common boundary between the sidewalls 119 and 121 and the top surface 116 of the silicon island 114. An arrangement of this type is referred to as edgeless since the gate electrode 122 does not extend over any sidewall, i.e. sidewalls 119 and 121.

In the first portion 116 of the silicon island 114, heavily doped N-type (N+) source and drain regions 124 and 126, respectively, extend from the top surface of the silicon island 114 to the interface between the silicon island 114 and the sapphire substrate 112. The heavily doped N-type (N+) source 124 and drain 126 regions each have an impurity concentration of about $10^{20}$ cm$^{-3}$. A lightly doped P-type (P−) channel region 128, having an impurity concentration of about $10^{16}$ cm$^{-3}$, is disposed between the source and drain regions 124 and 126, respectively. This channel region 128 is a part of the original lightly doped P-type first portion 116.

Lightly doped P-type (P−) regions 130 and 132 are disposed in the silicon island 114 contacting the respective source 124 and drain 126 regions. The lightly doped P-type (P−) regions 130 and 132 also contact a portion of the sidewall 119 of the silicon island 114. These lightly doped P-type regions (P−) 130 and 132 have an impurity concentration of at least about two orders of magnitude less than the impurity concentration of said N-type source 124 and drain 126 regions and, more particularly, about $10^{16}$ cm$^{-3}$. The lightly doped P-type (P−) regions 130 and 132 also extend from the top surface of the silicon island 114 to the interface between the silicon island 114 and the sapphire substrate 112. The junctions formed between the N+ source and drain regions 124 and 126, respectively, and the lightly doped P-type (P−) regions 130 and 132, respectively, form N+/P− diodes. These N+/P− diodes are in series with respect to the source 24 and drain 126 regions so as to eliminate the shorting paths between the source and drain regions of the N-channel transistor located in the areas of the island not subtended by the gate electrode 120 and outside the lightly doped P-type (P−) channel region 128. The N+/P− diode formed with the N+ source region 124 is forward biased while the reverse biased N+/P− diode formed with the N+ drain region 126 eliminates the shorting paths.

An additional heavily doped P-type (P+) region 134 is disposed between the lightly doped P-type (P−) regions 130 and 132. The additional heavily doped P-type (P+) region 134 also contacts a portion of the sidewall 119. The heavily doped P-type region 134 eliminates the shorting paths between the source 124 and drain 126 regions that would otherwise exist if the surface portions of the lightly doped P-type regions 130 and 132 should invert. The additional heavily doped P-type (P+) region 134 has an impurity concentration of at least about two orders of magnitude greater than the impurity concentration of the lightly doped P-type (P−) regions 130 and 132 and, more particularly, about $10^{20}$ cm$^{-3}$.

In the second portion 118 of the silicon island 114 heavily doped P-type (P+) source and drain regions 136 and 138, respectively, are disposed in the silicon island 114 so that they extend from the top surface of the island 114 to the interface with the sapphire substrate 112. These heavily doped P-type (P+) source and drain regions 136 and 138, respectively, each have an impurity concentration of about $10^{20}$ cm$^{-3}$. A lightly doped N-type (N−) channel region 140, having an impurity concentration of about $10^{16}$ cm$^{-3}$, is disposed between the heavily doped P-type (P+) source 136 and drain 138 regions.

Lightly doped N-type (N−) regions 142 and 144 are disposed in the silicon island 114 contacting the respective source 136 and drain 138 regions. These lightly doped N-type (N−) regions 142 and 144 extend from the top surface of the silicon island 114 to the interface with the sapphire substrate 112 and contact a portion of the sidewall 121. The lightly doped N-type (N−) regions 142 and 144 have an impurity concentration of at least about two orders of magnitude less than the impurity concentration of the P-type source 136 and drain 138 regions and, more particularly, about $10^{16}$ cm$^{-3}$. The lightly doped N-type (N−) regions 142 an 144 form P+/N− diodes in series with the respective source 136 and drain 138 regions. These P+/N− diodes serve to eliminate the shorting paths which would otherwise exist between the source 136 and drain 138 regions in the areas of the island not subtended by the gate electrode 120 and outside the lightly doped N-type (N−) channel region 140. The P+/N− diode formed with the P+ source region 136 is forward biased while the P+/N− diode formed with the P+ drain region 138 is reverse biased to eliminate the shorting paths.

An additional heavily doped N-type (N+) region 146 is disposed between the lightly doped N-type (N−) regions 142 and 144 to guarantee electrical isolation between the source 136 and drain 138 regions in the event that the surfaces of the lightly doped portions 142 and 144 invert. This additional heavily doped N-type (N+) region 146 also contacts a portion of the sidewall 121. The additional heavily doped N-type (N+) region 146 has an impurity concentration of at least about two orders of magnitude greater than the lightly doped N-type (N−) regions 142 and 144 and, more particularly, about $10^{20}$ cm$^{-3}$.

As shown in FIGS. 2 and 3, a lightly doped P-type (P−) region 148, having an impurity concentration of about $10^{16}$ cm$^{-3}$, is positioned adjacent the N+ source 124 and drain 126 regions. A heavily doped P-type (P+) region 152, having an impurity concentration of at least about two orders of magnitude greater than the lightly doped P-type (P−) region 148 and, more particularly, about $10^{20}$ cm$^{-3}$, is disposed adjacent to the lightly doped P-type (P−) region 148 and under the gate electrode 122. The lightly doped P-type (P−) region 148 as well as the heavily doped P-type (P+) region 152 are considered to be included in the first portion 116 of the silicon island 114. The junctions between the N+ source 124 and drain 126 regions and the lightly doped P-type (P−) region 148 form N+/P− diodes. These N+/P− diodes are disposed outside of the lightly doped P-type (P−) channel region 128 in a back-to-back series arrangement with respect to the N+ source 124 and drain 126 regions. The back-to-back diodes in the first portion 116 eliminate the shorting paths between the N+ source 124 and drain 126 regions in the area of the silicon island 114 subtended by the electrode 122 and adjacent to the second portion 118. The N+/P− diode formed between the N+ drain 126 and the lightly doped P-type (P−) region 148 is reverse biased to eliminate shorting paths between the source 124 and drain 126 regions along the heavily doped P-type (P+) region 152. The N+/P− diode formed between the N+ source region 124 and the lightly doped P-type (P−) region 148 is forward biased because the source is at the lower potential, typically ground.

A lightly doped N-type (N−) region 150 is also disposed adjacent the P+ source 136 and drain 138 regions. The lightly doped N-type (N−) region 150 has an impurity concentration of about $10^{16}$ cm$^{-3}$. A heavily doped N-type (N+) region 154, having an impurity concentration of at least two orders of magnitude greater than the lightly doped N-type (N−) region 150 and, more particularly, about $10^{20}$ cm$^{-3}$, is disposed adjacent to the lightly doped N-type (N−) region 150 and under the gate electrode 122. The lightly doped N-type (N−) region 150 as well as the heavily doped N-type (N+) region 154 are considered to be included in the second portion 118 of the silicon island 114. The junctions between the P+ source 136 and drain 138 regions and the lightly doped N-type (N−) region 150 form P+/N− diodes which are disposed outside of the lightly doped N-type (N−) channel region 140. The P+/N− diodes in the second portion 118 eliminate the shorting paths between the P+ source 136 and drain 138 regions in the area of the silicon island subtended by the gate electrode 122 and adjacent to the first portion 116. These P+/N− diodes are in a back-to-back series arrangement with respect to the P+ source 136 and drain 138 regions. The P+/N− diode formed between the P+ drain 138 and the light doped N-type (N−) region 150 is reverse biased to eliminate the shorting paths between the source 136 and drain 138 regions along the heavily doped N-type (N+) region 154. The P+/N− diode formed between the P+ source 136 and the lightly doped N-type (N−) region 150 is forward biased.

The heavily doped P-type (P+) region 152 is separated from the heavily doped N-type (N+) region 154 by an intermediate region 156 which extends under the gate electrode 122. This intermediate region 156 may be either lightly doped N-type or P-type. In the event that the intermediate 156 is lightly doped N-type, the junction between intermediate region 156 and the heavily doped P-type region (P+) region 152 forms a reverse biased P+/N− junction which is used to electrically isolate the first portion 116 of the silicon island 114 from the second portion 118 of the silicon island 114. This P+/N− diode is considered to be disposed between the first 116 and second 118 portions of the silicon island 114. If the reverse biased P+/N− diode was not present, when the N-channel transistor formed in the first portion 116 is on, a shorting path would form between the P+ source region 136 and the N+ source region 124 because of the forward biased diode formed between the inverted P-type channel 128 and the P+ source region 136. Similarly, when the P-channel transistor formed in the second portion 118 is on, the reverse biased P+/N− diode would eliminate the shorting path which would otherwise form between the P+ source region 136 and the N+ source region 124 because of the forward biased diode formed between the inverted N-type channel 140 and the N+ source region 124.

In the event that the intermediate region 156 is lightly doped P-type, the junction with the heavily doped N-type region 154 forms an N+/P− junction which is reverse biased to electrically isolate the first portion 116 of the silicon island 114 from the second portion 118 of the silicon island 114. In either case, the intermediate region 156 has an impurity concentration of at least about two orders of magnitude less than the impurity concentration of the heavily doped regions 152 and 154 and, more particularly, about $10^{16}$ cm$^{-3}$.

The device 100 would be fabricated by first defining the silicon island 114 on a sapphire substrate 112. Then, the island 114 would be lightly doped both P and N-types so as to form the first 116 and second 118 portions, respectively. A masking layer, such as a photoresist, would be deposited and patterned so as to expose only the areas which correspond to the heavily doped P-type (P+) regions 134 and 152. Then, a P-type dopant would be implanted into the silicon island to form the regions 134 and 152. Alternatively, the heavily doped P-type (P+) region 134 could be formed after the gate electrode 122 has been deposited and defined. The photoresist would then be removed and a new photoresist layer would be applied so that the areas corresponding to the heavily doped N-type (N+) regions 146 and 154 are exposed. An N-type dopant would then be ion implanted into the silicon island to form these heavily doped regions 146 and 154. Also, the area over the heavily doped region 146 could also be covered during this implantation step so that the region 146 would be formed after the gate electrode 122 has been applied and defined. The photoresist used during the N-type implantation step would then be removed.

The gate insulating layer 120, such as silicon dioxide, and the gate electrode 122, such as N-type polycrystalline silicon, would be deposited and defined using conventional techniques. Then, the photoresist would be deposited and patterned such that the areas corresponding to the heavily doped N-type (N+) source and drain regions 124 and 126 along with the heavily doped N-type (N+) region 146, if it was not formed before the gate electrode was deposited, are exposed. N-type dopants are implanted into the silicon island to dope these regions N-type. The photoresist layer would be removed and an additional photoresist masking layer would be applied and defined so that the areas corresponding to the heavily doped P-type source and drain regions 136 and 138, respectively, and the heavily doped P-type (P+) portion 134, if it was not formed before the gate electrode was deposited, are left exposed. P-type dopants would then be ion implanted into the silicon island to dope these regions P-type. The photoresist would then be removed. It should be noted that the lightly doped P-type (P−) portions 128, 130, 132 and 148 are part of the originally lightly doped P-type portion 116 of the silicon island 114. In a similar manner, the lightly doped N-type (N−) regions 140, 142, 144 and 150 are part of the original lightly doped N-type second portion 118. The intermediate region 156 would be masked during the doping steps so that it remains either lightly doped N-type or P-type.

As an alternative embodiment of the present invention, the lightly doped P-type (P−) region 130 and the portion of the lightly doped P-type (P−) region 148 contacting the N+ source region 124 are eliminated. By eliminating these regions, the heavily doped P-type (P+) regions 134 and 152 would contact the N+ source region and form N+/P+ diodes, rather than the N+/P− diodes formed with the N+ source region 124 shown in FIGS. 2 and 3. The lightly doped N-type (N−) region 142 and the portion of the lightly doped N-type (N−) region 150 contacting the P+ source 136 could also be eliminated. P+/N+ diodes, rather than P+/N− diodes, would then be formed with the P+ source region 136.

Since the gate electrode of the complementary-metal-oxide-semiconductor device of the present invention does not extend over the sidewalls of the silicon island, the parasitic edge transistors are eliminated. Additionally, since the gate electrode does not extend over the sidewalls, the gate breakdown, due to insufficient dielectric material on the sidewalls and the high electrical fields along the sharp angled edges of the island, is also eliminated.

Although the present invention has been illustrated using a substantially rectangular semiconductor island, other geometrical shapes, such as discs, could be substituted without departing from the scope of the invention.

We claim:

1. A common island semiconductor device comprising:
   an island of semiconductor material disposed on an insulating substrate, said island having a top surface and being completely surrounded by a peripheral sidewall, with a common boundary between said top surface and said sidewall;
   said island being divided into a P type portion and an N type portion, with a junction between said P type portion and said N type portion,
   a gate electrode insulatingly overlying said island, and extending from a first termination point within said P type portion across said junction to a second termination point within said N type portion, said first termination point and said second termination point each being spaced from said sidewall, and said gate electrode lying entirely within and spaced from said common boundary, with a P type channel stop area extending from said first termination point to said common boundary, and an N type channel stop area extending from said second termination point to said common boundary,
   N type source and drain regions within said P type portion, spaced from each other by the P type portion underlying said gate electrode and by said P type channel stop area, said N type source region extending to said sidewall at a first location within said P type portion, and said N type drain region extending to said sidewall at a second location spaced from said first location,
   P type source and drain regions within said N type portion, spaced from each other by the N type portion underlying said gate electrode and by said N type channel stop area, said P type source region extending to said sidewall at a third location within said N type portion, and said P type drain region extending to said sidewall at a fourth location spaced from said third location.

2. A common island semiconductor device according to claim 1, wherein said P type channel stop area contains a first channel stop region of P conductivity type having an impurity concentration of at least about two orders of magnitude greater than said P type portion disposed therein and extending from said first termination point to said common boundary, said first channel stop region being spaced from said N type source and said N type drain by portions of said P type portion, and wherein said N type channel stop area contains a second channel stop region of N conductivity type having an impurity concentration of at least about two orders of magnitude greater than said N type portion disposed therein and extending from said second termination point to said common boundary, said second channel stop region being spaced from said P type source and said P type drain by portions of said N type portion.

3. A common island semiconductor device according to claim 1, wherein a second channel stop region of P conductivity type having an impurity concentration of at least about two orders of magnitude greater than said P type portion is provided within said P type portion, said second channel stop region of P conductivity type extending from a part of said sidewall lying between said first location and said junction to a part of said sidewall lying between said second location and said junction, said second channel stop region of P conductivity type spacing said N type drain and said N type source from said junction, and wherein a second channel stop region of N conductivity type having an impurity concentration of at least about two orders of magnitude greater than said N type portion is provided within said N type portion, said second channel stop region of N conductivity type extending from a part of said sidewall lying between said third location and said junction to a part of said sidewall lying between said fourth location and said junction, said second channel stop region of N conductivity type spacing said P type drain and said P type source from said junction.

4. A common island semiconductor device according to claim 2, wherein a second channel stop region of P conductivity type having an impurity concentration of at least about two orders of magnitude greater than said P type portion is provided within said P type portion, said second channel stop region of P conductivity type extending from a part of said sidewall lying between said first location and said junction to a part of said sidewall lying between said second location and said junction, said second channel stop region of P conductivity type spacing said N type drain and said N type source from said junction, and wherein a second channel stop region of N conductivity type having an impurity concentration of at least about two orders of magnitude greater than said N type portion is provided within said N type portion, said second channel stop region of N conductivity type extending from a part of said sidewall lying between said third location and said junction to a part of said sidewall lying between said fourth location and said junction, said second channel stop region of N conductivity type spacing said P type drain and said P type source from said junction.

5. A common island semiconductor device according to claim 1 wherein said semiconductor material is silicon and said insulating substrate is sapphire.

* * * * *